US006891187B2

(12) United States Patent
Cho et al.

(10) Patent No.: US 6,891,187 B2
(45) Date of Patent: May 10, 2005

(54) OPTICAL DEVICES WITH HEAVILY DOPED MULTIPLE QUANTUM WELLS

(75) Inventors: Alfred Yi Cho, Summit, NJ (US); Claire F. Gmachl, New Providence, NJ (US); Hock Min Ng, Mountainside, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/126,282

(22) Filed: Apr. 19, 2002

(65) Prior Publication Data

US 2003/0042478 A1 Mar. 6, 2003

Related U.S. Application Data

(60) Provisional application No. 60/313,403, filed on Aug. 17, 2001.

(51) Int. Cl.[7] ................................................. H01L 33/00
(52) U.S. Cl. ........................................... 257/15; 257/22
(58) Field of Search ..................................... 257/15, 22

(56) References Cited

U.S. PATENT DOCUMENTS 5,747,827 A * 5/1998 Duggan et al. ............... 257/15
6,278,134 B1 * 8/2001 Capasso et al. .............. 257/96
6,455,870 B1 * 9/2002 Wang et al. .................. 257/12

OTHER PUBLICATIONS

N. Suzuki et al., "Feasibility Study on Ultrafast Nonlinear Optical Properties of 1.55–$\mu$m Intersubband Transition in AlGaN/GaN Quantum Wells," Jpn. J. Appl. Phys., 36, pp. L1006–L1008, 1997.
N. Suzuki et al., "Effect of Polarization Field on Intersubband Transition in AlGaN/GaN Quantum Wells," Jpn. J. Appl. Phys., 38, pp. L363–L365, 1999.

N. Iizuka et al., "Ultrafast Intersubband Relaxation ($\leq$150 fs) In AlGan/GaN Multiple Quantum Wells," Appl. Phys. Lett., 77, pp. 648–650, 2000.
C.P. Garcia et al., "1.26$\mu$m Intersubband Transitions In $In_{0.3}Ga_{0.7}As/AlAs$ Quantum Wells," Appl. Phys. Let., 77, pp. 3767–3769, 2000.
R. Akimoto et al., "Short–Wavelength Intersubband Transitions Down To 1.6 $\mu$m In ZnSe/BeTe Type–II Superlattices," Appl. Phys. Lett., 78, pp. 580–583, 2001.
C. Gmachl et al., "Intersubband Absorption at $\lambda$~1.55 $\mu$m In Well– and Modulation–Doped GaN/AlGaN Multiple Quantum Wells With Superlattice Barriers," Appl. Phys. Lett., 77, pp. 3722–3724, 2000.
C. Gmachl et al., "Sub–picosecond Electron Scattering Time for $\lambda$~1.55$\mu$m Intersubband Transitions in Gan/AlGaN Multiple Quantum Wells," Electron. Lett., 37, pp. 378–380, 2001.
N. Grandjean et al., "Built–in Electric–field Effects in Wurtzite AlGaN/GaN Quantum Wells," J. Appl. Phys., 86, pp. 3714–3719, 1999.
F. Bernardini et al., "Spontaneous Polarization and Piezoelectric Constants of III–V Nitrides," Phys. Rev. B, 56, pp. R10024–R10027, 1997.
H.M. Ng et al., "Molecular Beam Epitaxy of GaN/$Al_xGa_{1-x}N$ Superlattices for 1.52–4.2 $\mu$m Intersubband Transitions," J. Cryst. Growth, 220, pp. 432–438, 2000.

(Continued)

Primary Examiner—Bradley Baumeister

(57) ABSTRACT

A quantum well structure is provided that includes two or more quantum well layers coupled by at least one barrier layer such that at least one of a piezo-electric field and a pyro-electric field is produced. The quantum well structure is sufficiently doped to cause a Fermi energy to be located between ground states and excited states of the coupled quantum well layers. The quantum well structure can be incorporated into a layered semiconductor to form optical devices such as a laser or optical amplifier.

22 Claims, 6 Drawing Sheets

OTHER PUBLICATIONS

H.M. Ng et al., "In Situ Determination of Growth Rate by Pyrometric Interferometry During Molecular–Beam Epitaxy: Application to the Growth of AlGaN/GaN Quantum Wells," J. Vac. Sci. Technol., A19, pp. 292–294, 2001.

C. Gmachl et al., "Intersubband Absorption in GaN/AlGaN Multiple Quantum Wells in the Wavelength Range of $\lambda \sim 1.75$–$4.2$ $\mu m$," Appl. Phys. Lett., 77, pp. 334–336, 2000.

F. Capasso et al., "New Frontiers in Quantum Cascade Lasers and Applications," IEEE Journal on Selected Topics in Quantum Electronics, vol. 6, No. 6, pp. 931–947, Nov./Dec. 2000.

T. Mozume et al., "Near–Infrared Intersubband Transitions in InGaAs/AlAsSb Coupled Double Quantum Wells Grown by Molecular Beam Epitaxy," Inst. Phys. Conf. Ser. No. 162: Chapter 3, pp. 131–136, Oct. 1998.

* cited by examiner

OPTICAL DEVICES WITH HEAVILY DOPED MULTIPLE QUANTUM WELLS

PRIORITY CLAIM

The present application claims the priority of U.S. Provisional Application No. 60/313,403, filed Aug. 17, 2001.

FIELD OF THE INVENTION

This invention relates generally to optical devices and, more specifically, to optical devices with heavily doped multiple quantum wells.

BACKGROUND OF INVENTION

Intersubband (IS) transitions in semiconductor heterostructures with large band offset have recently seen a surge in interest. See, e.g., N. Suzuki et al., "Feasibility Study on Ultrafast Nonlinear Optical Properties of 1.55-μm Intersubband Transition in AlGaN/GaN Quantum Wells," Jpn. J. Appl. Phys., 36, pp. L1006–L1008 (1997); N. Suzuki et al., "Effect of polarization Field on Intersubband Transition in AlGaN/GaN Quantum Wells," Jpn. J. Appl. Phys., 38, pp. L363–L365 (1999); N. Iizuka et al., "Ultrafast Intersubband Relaxation ($\leq 150$ fs) In AlGan/GaN Multiple Quantum Wells," Appl. Phys. Lett., 77, pp. 648–650 (2000); C. P. Garcia et al., "1.26 cm Intersubband Transitions In $In_{0.3}Ga_{0.7}As/AlAs$ Quantum Wells," Appl. Phys. Let., 77, pp.3767–3769 (2000); R. Akimoto et al., "Short-Wavelength Intersubband Transitions Down To 1.6 μm In ZnSe/BeTe Type-II Superlattices," Appl. Phys. Lett., 78, pp. 580–583 (2001), each of which is incorporated herein by reference. This fuels attempts to extend the wavelength range of IS-based optical devices to the fiber-optics wavelength range around 1.55 μm. GaN/AlGaN-based heterostructures are of particular interest due to their large effective electron mass ($m^* \sim 0.2 \sim 0.3$ $m_0$, with $m_0$ being the electron rest mass) and large longitudinal optical (LO) phonon energy ($E_{LO} \sim 90$ meV). Both are essential to achieve ultra fast electron relaxation at large transition energies, i.e. short wavelengths. GaN/AlGaN quantum wells with IS transition wavelengths as short as 1.4 μm have been demonstrated. See, e.g., C. Gmachl et al., "Intersubband Absorption at $\lambda \sim 1.55$ μm In Well- and Modulation-Doped GaN/AlGaN Multiple Quantum Wells With Superlattice Barriers," Appl. Phys. Lett., 77, pp.3722–3724 (2000), which is incorporated herein by reference. In addition, the IS electron relaxation time has been measured as 150 fs and 370 fs for IS-transitions at 4.5 μm and 1.7 μm wavelength, respectively, as described in N. Iizuka et al.,(2000) cited above, and C. Gmachl et al., "Sub-picosecond Electron Scattering Time for $\lambda \sim 1.55$ μm Intersubband Transitions in Gan/AlGaN Multiple Quantum Wells," Electron. Lett., 37, pp. 378–380 (2001), which are incorporated herein by reference. So far, however, IS-transitions have been experimentally studied in stacks of isolated single quantum wells.

More complex devices will require multiple active quantum wells and inter-well electron transfer to produce a pumpable population inversion for laser action. To that aim, the large effective electron mass becomes a hindrance when very thin barriers are necessary for efficient energy tunneling between wells. In addition, large intrinsic piezo- and pyro-electric fields have been reported in GaN type devices. See, e.g., N. Grandjean et al., "Built-in Electric-field Effects in Wurtzite AlGaN/GaN Quantum Wells," J. Appl. Phys., 86, pp. 3714–3719 (1999) and F. Bernardini et al., "Spontaneous Polarization and Piezoelectric Constants of III–V Nitrides," Phys. Rev. B, 56, pp. R10024–R10027 (1997), each of which is incorporated herein by reference. The exact strength of such fields in large AlN-mole fraction materials that are used for barrier layers is largely unknown and are not easily determined from IS measurements. In addition, coupling quantum wells produces Stark-shifts that produce further uncertainties in relative locations of energy levels of adjacent quantum wells.

In order for electrons to tunnel resonantly between quantum wells, the height of the energy levels must be substantially equivalent. In addition, in order to generate light of a certain wavelength, the energy level of the quantum well must be known to effectively calculate the change in energy level when the light is emitted. However, as stated above, the generation of large electric fields when using multiple quantum wells can skew the energy levels of the quantum wells, making the energy levels unknown.

To produce optical devices based on coupled quantum wells, there exists a need for a method of eliminating uncertainties between relative values of energy levels even in the presence of these intrinsic internal electric fields.

SUMMARY OF THE INVENTION

In one aspect of the invention, a quantum well structure is provided. The quantum well structure includes two or more quantum well layers coupled by at least one barrier layer such that at least one of a piezo-electric field and a pyro-electric field is produced. For example, the quantum well structure can include two quantum well layers coupled by a common barrier layer located between the two quantum well layers. The quantum well structure is sufficiently doped to cause a Fermi energy to be located between ground states and excited states of the coupled quantum well layers. Preferably, the coupled quantum well layers are doped with silicon to a density of about $1 \times 10^{19}$ cm$^{-3}$ to about $5 \times 10^{20}$ cm$^{-3}$.

In a preferred embodiment, the quantum well layers include gallium and nitrogen. In another preferred embodiment, the barrier layer includes aluminum, gallium, and nitrogen. The barrier layer preferably includes an AlN mole fraction of between about 0.5 to 1.0.

In another aspect of the invention, a layered semiconductor is provided. The semiconductor includes a plurality of quantum well structures and at least one barrier region disposed to interleave the plurality of quantum well structures. At least one of the quantum well structures include two or more quantum well layers coupled by at least one barrier layer such that at least one of a piezo-electric and a pyro-electric field is produced. The quantum well structure is sufficiently doped to cause a Fermi energy to be located between ground states and excited states of the coupled quantum well layers. The barrier region can include an AlN mole fraction is of between about 0.5 to 1.0.

In another aspect of the invention, an apparatus is provided that includes a waveguide and a layered semiconductor as described above. The apparatus also includes an energy source configured to supply energy to the quantum well structure of the layered semiconductor. Preferred energy sources include a light source or electrical source configured to pump the quantum well structure. Also, the semiconductor can include optical properties that are modulated by light or electricity produced by the energy source. The waveguide may include cladding disposed around the structure. The waveguide may also couple to an optical feedback device, such as a reflector, to form a laser cavity.

In another aspect of the invention a method is provided. The method is for aligning energy levels of coupled quantum well layers within a quantum well structure. The quantum well structure includes two or more quantum well layers coupled by at least one barrier layer, such that at least one of a piezo-electric field and a pyro-electric field is produced. The method includes doping the quantum well structure sufficiently to produce a Fermi energy located between ground states and excited states of the coupled quantum wells. The quantum well structure is preferably doped with silicon to a density of about $1 \times 10^{19}$ cm$^{-3}$ to about $5 \times 10^{20}$ cm$^{-3}$.

DETAILED DESCRIPTION OF THE INVENTION

Figure 1A:
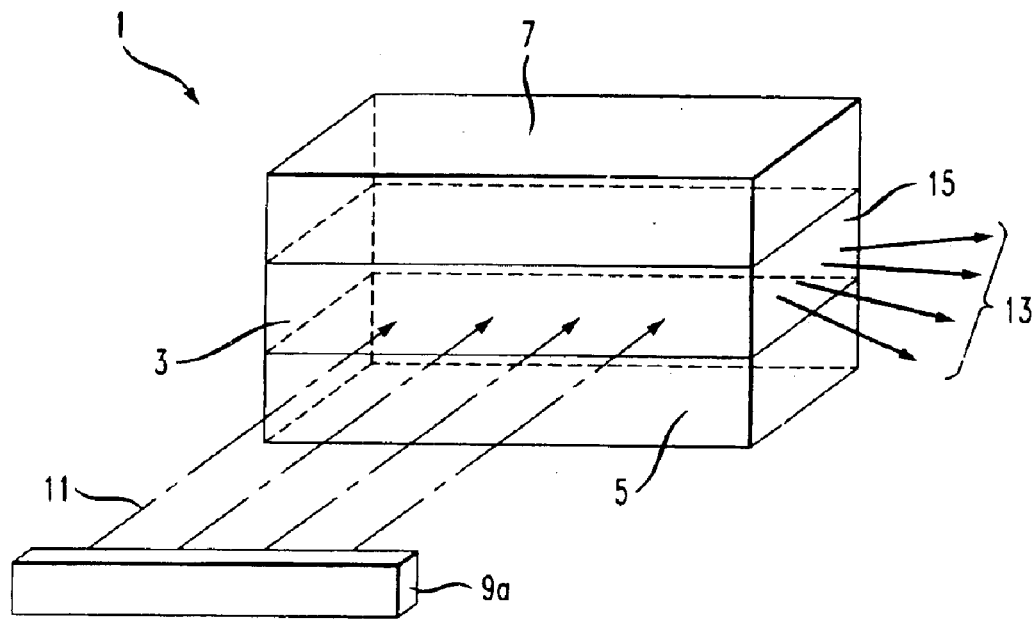
FIG. 1A illustrates an optically pumped heterostructure including the layered semiconductor shown in FIG. 2.

FIG. 1A shows a heterostructure 1 according to the invention. The heterostructure is exemplary only and can be used in various optical devices such as optical detectors, modulators, amplifiers, and lasers. Such heterostructures are generally fabricated by epitaxial techniques. These include molecular beam epitaxy (MBE) and metalorganic chemical vapor deposition (MOCVD). MBE and MOCVD are preferred. Liquid phase epitaxy (LPE) does not permit as precise control of the fabricated structure.

The heterostructure 1 includes a layered semiconductor 3, which is further described in connection with FIG. 2. The heterostructure 1 also includes a lower cladding layer 5 located below the layered semiconductor 3 and an upper cladding layer 7 located above the layered semiconductor 3. The layered semiconductor serves as an optical waveguide core for which layers 5 and 7 are optical cladding. The cladding layers 5 and 7 can include, for example, sapphire, SiO$_2$, fluorine doped SiO$_2$, or chalcogenides. The cladding layers can vary in width, for example, from about 0.2 μm to about 2.0 μm when deposited during a crystal growth process. However, the width can be much greater if it also serves as the growth template and support structure.

Figure 1B:
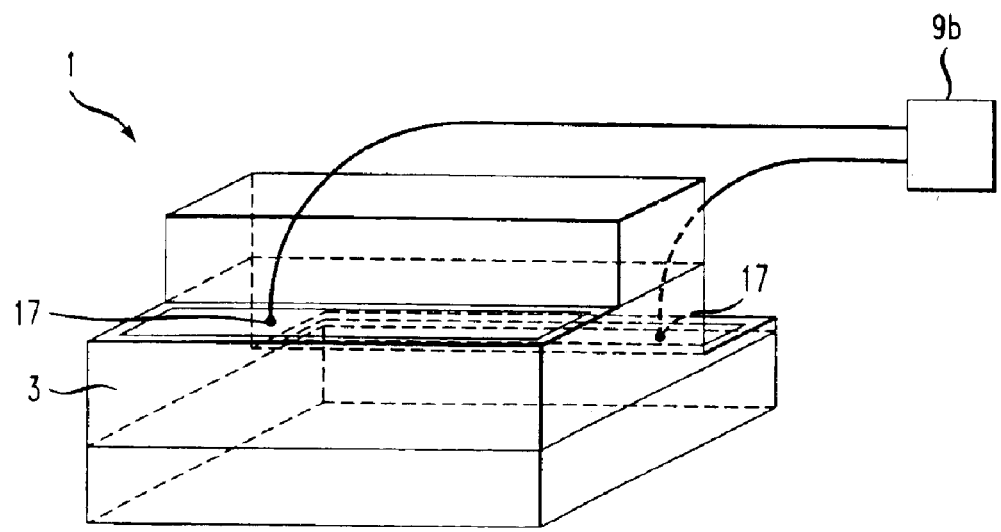
FIG. 1B illustrates an electrically pumped heterostructure including the layered semiconductor shown in FIG. 2.

The heterostructure 1 also includes a conventional energy source. The energy source can serve, for example, to pump a quantum well structure within the layered semiconductor 3. The pumping can be performed, e.g., optically or electrically. For example, in FIG. 1A, the energy source 9a provides pump light 11. The pump light 11 is absorbed by the layered semiconductor 3 and then optical output 13 is generated. Another example of an energy source is shown in FIG. 1B. In FIG. 1B, an electrical energy source 9b of the heterostructure 1 is coupled to electrical contacts 17 attached to the semiconductor 3. The electrical energy source 9b is capable, for example, of passing an electric current through the core layered structure 3. Pump light or electric current from the energy source can be used to modulate the optical properties of the layered structure, e.g., refractive index or absorption, permitting the structure to act as a modulator.

The heterostructure 1 can be utilized, for example, as part of a laser or optical amplifier. When used in an amplifier, the ends 15 of the layered semiconductor 3 function as input and output of the amplifier. Such an optical amplifier can function as a wavelength converter. When used in a laser, the waveguide can be coupled to an optical feedback device, such as a reflector, to form a laser cavity. For example, the ends 15 of the layered semiconductor 3 can act as reflectors or partial reflectors. The heterostructure can be utilized in other forms familiar to those skilled in the art, for example, distributed feedback, distributed Bragg reflector, or whispering gallery type resonators.

Figure 2:
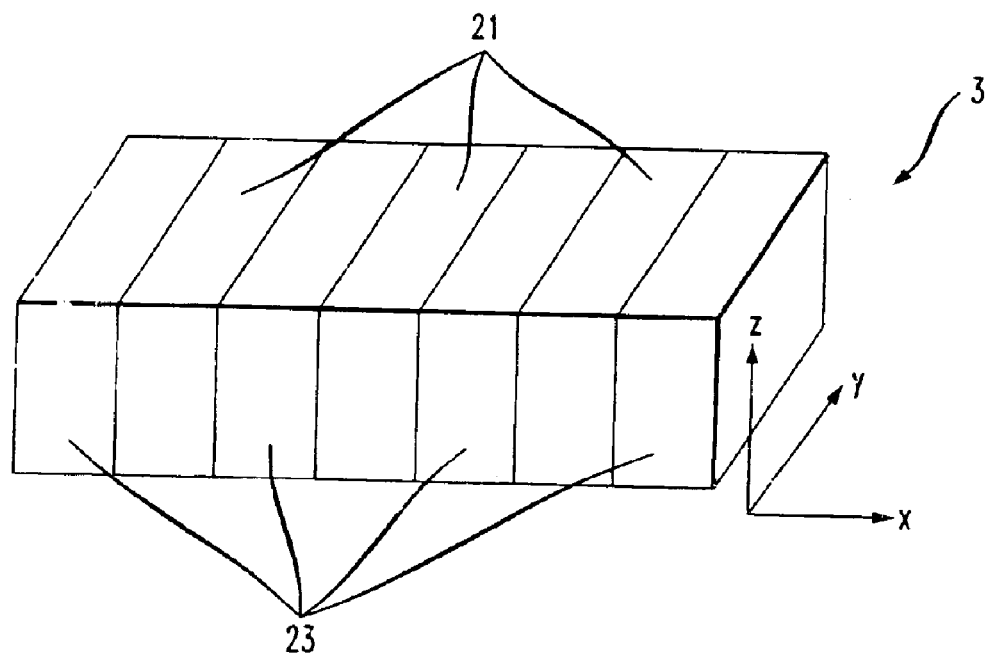
FIG. 2 shows a view of a layered semiconductor in accordance with the present invention.

FIG. 2 shows an oblique view of the layered semiconductor 3 of the invention. The structure 3 includes quantum well structures 21 that are coupled to barrier regions 23. The barrier regions 23 interleave and isolate the quantum well structures 21. The barrier regions 23 can include conventional materials such as aluminum gallium nitride (AlGaN), gallium nitride (GaN), aluminum nitride (AlN), and indium aluminum nitride (InAlN). The barrier region 23 can be implemented in different forms. For example, the barrier regions 23 can be bulk-like barriers or doped or undoped superlattice barriers. The barrier regions 23 should be sufficiently thick to isolate each of the quantum well structures 21 such that the Fermi energy in each quantum well structure 21 is independent from the Fermi energy of other quantum well structures.

Although FIG. 2 depicts three quantum well structures 21 and four barrier regions 23 located between the quantum well structures 21, the invention is not limited to the number of quantum well structures 21 or barrier 23 regions. The number of layers in the semiconductor 3 can vary, for example, between about 1 to about 100. Approximately 15 to 20 layers are preferred. In general, it is preferred that the thickness of the semiconductor 3 be less than 10 microns, more preferably between about 0.2 to about 1 micron.

The quantum well structures contain at least two quantum well layers. The quantum well layers can also be referred to as quantum wells. The quantum well layers within a given one of the quantum well structures are coupled by a thin barrier layer. Thus, the quantum well layers within the quantum well structures are referred to herein as "coupled" quantum wells. The invention is not limited to the number of quantum well layers within the quantum well structure. However, 2–10 quantum well layers are preferred.

Figure 3:
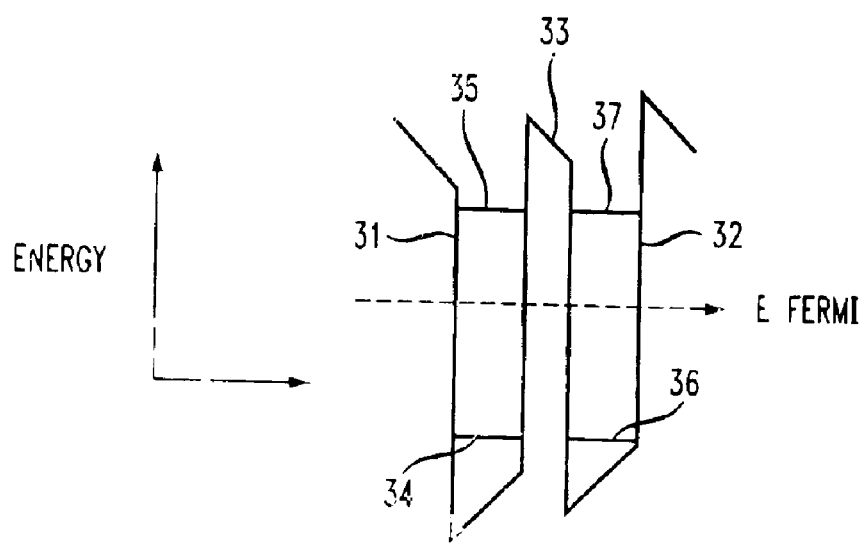
FIG. 3 illustrates energy levels of coupled quantum well layers according to the invention.

FIG. 3 shows two coupled quantum well layers, a left quantum well layer 31 and a right quantum well layer 32, that reside within a given quantum well structure 21. The quantum well layers 31 and 32 are each separated by and coupled by a thin barrier layer 33. Two quantum well layers separated and coupled by a barrier layer as shown can be called a double quantum well (DQW). Although only two quantum well layers are shown in FIG. 3, many more quantum well layers, each coupled to and separated from one another by a thin barrier layer, could be provided. The thin barrier layer 33 resides within the quantum well structure 21 and is distinguished from the barrier region 23 depicted in FIG. 2.

The quantum well layers within the quantum well structure, e.g., layers 31 and 32, and the thin barrier layer that couples the quantum well layers, e.g., barrier layer 33, include materials with lattice mismatches and discontinuities of the material composition at the interfaces between the thin barrier layer 33 and the quantum well layers 31 and 32. These mismatches and discontinuities generate at least one of a piezo-electric field and a pyro-electric field. Typically, both a piezo-electric field and a pyro-electric field are generated. However, under certain conditions, one or the other of these electric fields may be produced. These electric fields can cause uncontrollable mismatched alignments between the original ground states of the coupled quantum wells when isolated. According to the invention, the energy levels of the coupled quantum wells are brought into alignment by heavy doping of the quantum well structure 21.

The quantum well layers 31 and 32 can comprise conventional materials. For example, the quantum well layers can include GaN. Other suitable materials include InGaN and AlGaN. In order to reach IS transitions with wavelengths of around 1.55 $\mu$m, quantum well widths of each less than about 25 Å are usually required. Quantum well layer widths generally range each from about 5 Å to about 25 Å. Preferred widths range each from about 10 Å to about 15 Å.

The thin barrier layer 33 coupled to the quantum well layers can also include conventional materials. For example, the thin barrier layer 33 can include AlGaN. Other suitable materials include AlN, or GaN when used with InGaN in quantum well material. The thin barrier layer 33 must be thin enough to permit energy tunneling between the quantum well layers. Preferred barrier widths generally range from about 5 Å to about 20 Å and more preferably from about 5 Å to about 10 Å.

Doping of the quantum well structure 21 is performed by adding a material that provides free electrons in the quantum well layers 31 and 32, or the thin barrier layer 33. One example of such a material is silicon (Si), which is the preferred dopant for GaN and InGaN material.

The quantum well structures 21 can be doped by conventional means. For example, the quantum well layers within the quantum well structures can be doped directly or indirectly. Indirect doping can be achieved by a procedure called modulation doping. The quantum well structures 21 are doped with a carrier density, for example, in the range of about $1 \times 10^{19}$ cm$^{-3}$ to about $5 \times 10^{20}$ cm$^{-3}$.

A preferred method of modulation doping of quantum well layers is disclosed in C. Gmachl et al., "Intersubband absorption at ~1.55 $\mu$m in well- and modulation-doped GaN/AlGaN multiple quantum well layers with superlattice barriers," Applied Physics Letters, 77, pp. 3722–3724 (2000), which is incorporated herein by reference. In this method of doping, the silicon atoms are not directly deposited into the quantum well structure. Rather, the silicon atoms are deposited through doping of inactive quantum wells of superlattices within the barrier region 23, with subsequent charge transfer into the quantum well structure, i.e. the active coupled quantum wells within the quantum well structure 21. Although this reference only relates to single active quantum wells as opposed to coupled quantum wells, as disclosed herein, the doping methods disclosed can be applied.

FIG. 3 also illustrates the hypothetical energy states of coupled quantum well layers 31 and 32 within a given quantum well structure 21. The ground state energy level 34 of the isolated left quantum well layer and the excited state energy level 35 of the isolated left quantum well layer are shown. In addition, the ground state energy level 36 of the isolated right quantum well layer and the excited state energy level 37 of the isolated right quantum well layer are shown. The coupled quantum well layers 31 and 32 are sufficiently doped so as to cause the Fermi energy, illustrated by a dashed line in the figure, to be above the ground state energy of each of the quantum well layers. In addition, the quantum well layers are sufficiently coupled such that they share the same Fermi level. Thus, the isolated ground states 34 and 36 of the respective coupled wells 31 and 32 align. In other words, a common energy reference level is established across the two coupled quantum well layers 31 and 32, which subsequently provides knowledge of the location of all remaining energy levels with respect to each other. Thus, the skewing of energy levels produced by the piezo-electric and/or pyro-electric field is mitigated.

Figure 4:
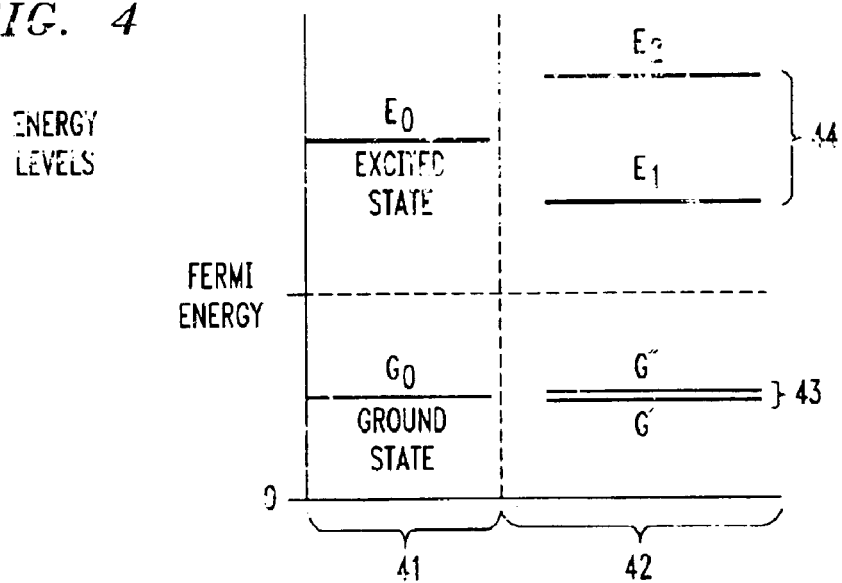
FIG. 4 illustrates energy levels of an isolated quantum well layer and a pair of coupled quantum well layers as shown in FIG. 3.

In FIG. 4 isolated energy levels are shown in a cross-sectional view for a single isolated quantum well layer 41 and for identical coupled quantum well layers that have been heavily doped 42, e.g., GaN wells degenerately doped with silicon. The coupling of the quantum well layers splits energies of the excited states of isolated quantum well layers 44 but does not significantly split energies of the ground states 43 of the isolated quantum well layers. The large splitting of energy levels of the excited state is due to both the strong coupling between the two quantum well layers and the alignment of levels of uncoupled wells that is produced by heavy doping. This splitting or "anti-crossing" is evidence of alignment of the states of the quantum well layers. The splitting occurs because of tunneling between the coupled quantum well layers. An anti-crossed alignment of energy levels can be used, for example, when a robustness of the energy level structure versus an externally applied electric field is desired.

Figure 5A:
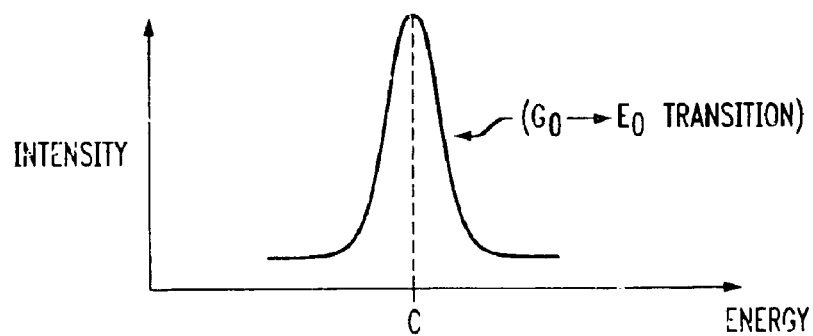
FIG. 5A shows an absorption spectrum of a single isolated quantum well layer of FIG. 4.
Figure 5B:
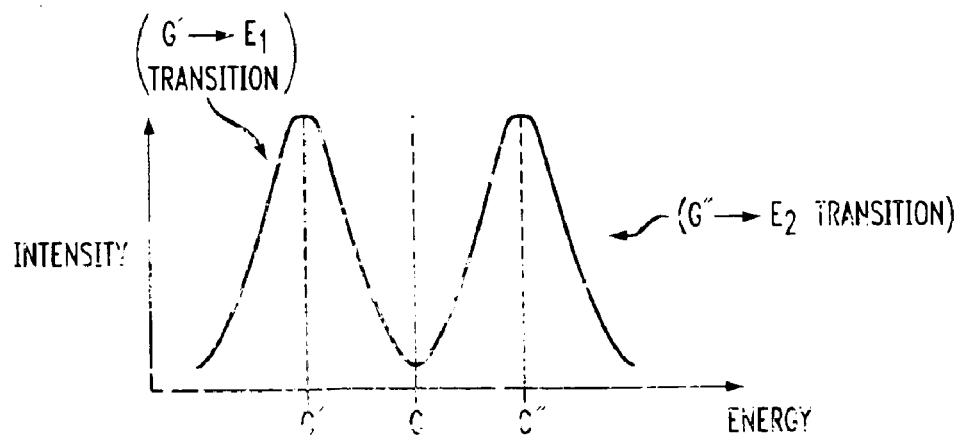
FIG. 5B shows an absorption spectrum of the pair of coupled quantum well layers of FIG. 4.

A different way of illustrating the energy levels of FIG. 4 is shown in FIGS. 5A and 5B. FIG. 5A is a graph of an absorption spectrum versus energy for an isolated quantum well layer 41 as depicted in FIG. 4. FIG. 5B is a graph of an absorption spectrum versus energy for a pair of coupled quantum well layers, such as the two quantum well layers 42 whose energy states are depicted in FIG. 4 and graphically illustrated as 31 and 32 in FIG. 3.

The following examples are provided to assist in a further understanding of the invention. The particular materials and conditions employed are intended to be further illustrative of the invention and are not limiting upon the reasonable scope thereof.

EXAMPLE 1

Symmetric and asymmetric coupled DQWs were grown by conventional means. Multi-pass IS-absorption at room temperature was used to probe the energy levels of the quantum well layers. Degenerate doping was employed to establish a common reference energy level. The resulting data show evidence of energy level splitting or "anti-crossing" in symmetric DQWs.

Table 1 gives an overview of the samples used in these examples. The table provides the sample numbers, referred to hereafter, the nominal layer thicknesses, and AlN-mole fractions. The AlN mole fraction indicates the percentage of aluminum in the quantum well layer. The crystal is grown with 1 atom of metal, i.e., either Al or Ga, per 1 atom of N. Thus, if the AlN mole fraction x equal 0.9, this means that 90% of the atoms are Al and the other 10% of the atoms are Ga. Preferred AlN mole fractions in both the barrier layer, i.e., "$d_B$," and the barrier region, i.e., "barrier," are from about 0.5 to 1.0.

The nominal widths of the two GaN quantum well layers are listed under "$d_{W1}$" and "$dW_2$." The nominal widths of the thin AlGaN barrier located between the quantum well layers are listed under "$d_B$." The "barrier" column is the width of the barrier region separating the adjacent quantum well structures. For example, in sample N306 the respective widths in the layer sequence are 12/10/12/50/12/10/12/50 . . . Å. "SL" barriers are superlattice layers containing 3 inactive quantum well layers 7.8 Å wide, separated by 15 Å wide barrier layers. Underlined layers indicate the location of intentional doping. More specifically, the quantum well layers of samples N306, N325 and N326 were intentionally doped. The superlattice was doped in samples N362, N366, N367, N369 and N378.

TABLE 1

Characteristic Sample Parameters

| Sample | $d_{w1}/d_B/d_{w2}$ (Å) | $x(Al_xGa_{1-x}N)$ | barrier (Å) |
|---|---|---|---|
| N306 | 12/10/<u>12</u> | 0.85–0.90 | 50 |
| N325 | <u>12</u>/60/<u>20</u> | 0.85–0.90 | 60 |
| N326 | 12/10/<u>20</u> | 0.85–0.90 | 60 |
| N362 | 12/10/20 | 0.60–0.65 | <u>SL</u> |
| N366 | 12/7/20 | 0.60–0.65 | <u>SL</u> |
| N367 | 9/7/15 | 0.60–0.65 | <u>SL</u> |
| N369 | 12/15/20 | 0.60–0.65 | <u>SL</u> |
| N378 | 20/10/12 | 0.60–0.65 | <u>SL</u> |

All structures were grown by molecular beam epitaxy (MBE) on c-axis sapphire and with buffer layers with varying thicknesses (typically 0.5~1 μm thick). Such methods are known and are described, for example, in H. M. Ng et al., "Molecular Beam Epitaxy of GaN/$Al_xGa_{1-x}$N Superlattices for 1.52–4.2 μm Intersubband Transitions," J. Cryst. Growth, 220, pp. 432–438 (2000), and H. M. Ng et al., "In Situ Determination of Growth Rate by Pyrometric Interferometry During Molecular-Beam Epitaxy: Application to the Growth of AlGaN/GaN Quantum Wells," J. Vac. Sci. Technol., A19, pp. 292–294(2001), which are incorporated herein by reference. The buffer layer serves to smooth the growth template for the growth of the quantum well layers. The buffer layer is typically bulk-like and may also serve as part of the waveguide core. GaN buffer layers were doped with Si to n~$1 \times 10^{17}$ cm$^{-3}$. A control sample with only a doped buffer was used to exclude any effect of the latter. Fifteen repetitions of a DQW were then grown, separated either by thick bulk-like AlGaN barriers or doped SL barriers. The DQWs were either directly or modulation-doped with a carrier density of between about $1 \times 10^{19}$ cm$^{-3}$ to about $1 \times 10^{20}$ cm$^{-3}$. The samples with underlined quantum well layers in Table 1 were doped by direct doping. Samples with the SL underlined in Table 1 indicate modulation doping. The layer structures were capped with few hundred Å of low-doped GaN. Thus, the doping levels of the buffer layer and cap layers are typically a factor of 100 below the doping levels of the active quantum well structures.

EXAMPLE 2

Figure 6:
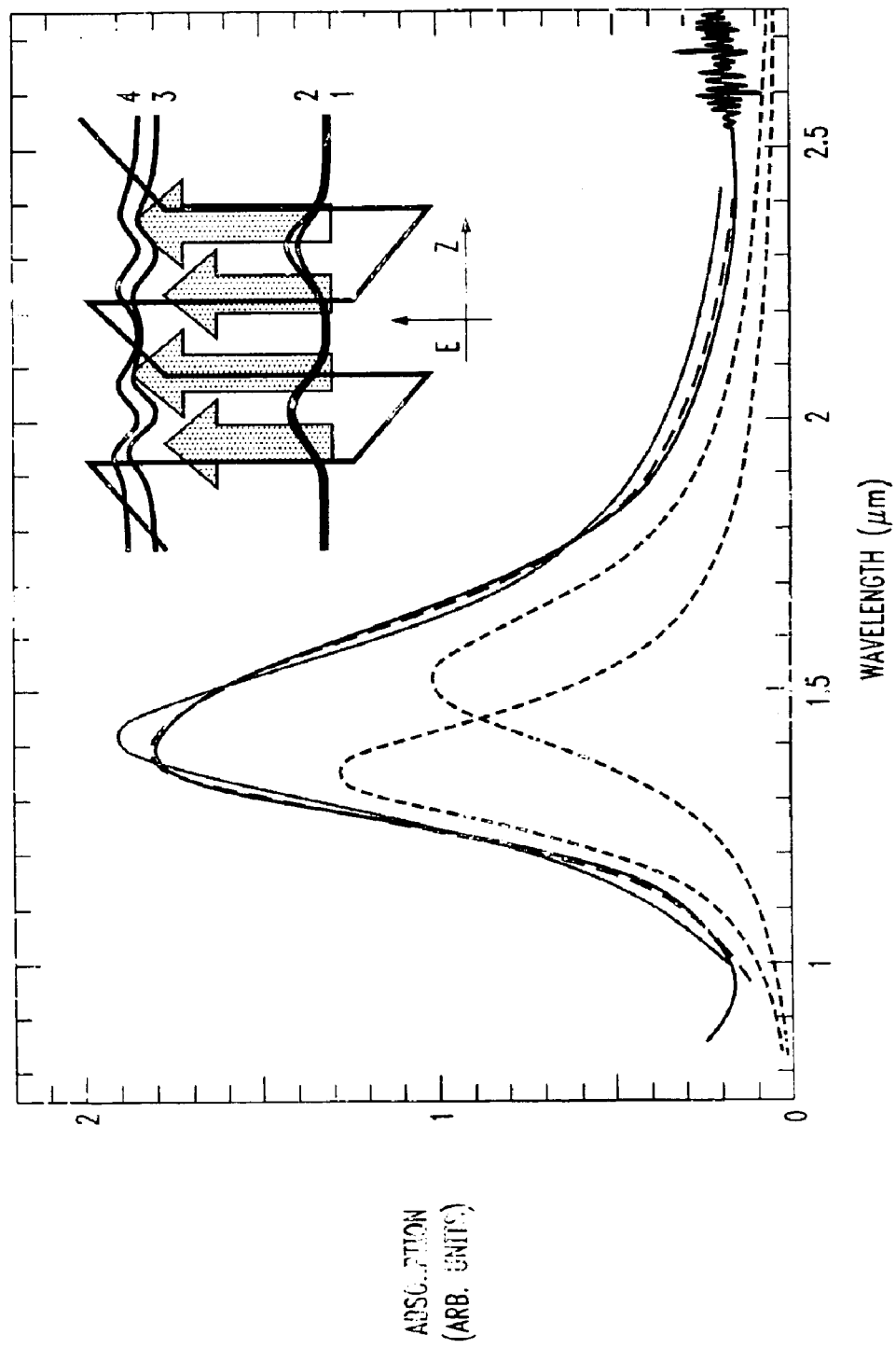
FIG. 6 is a graph showing the measured intersubband absorption results of a sample with symmetric double quantum well (DQW).
Figure 7A:
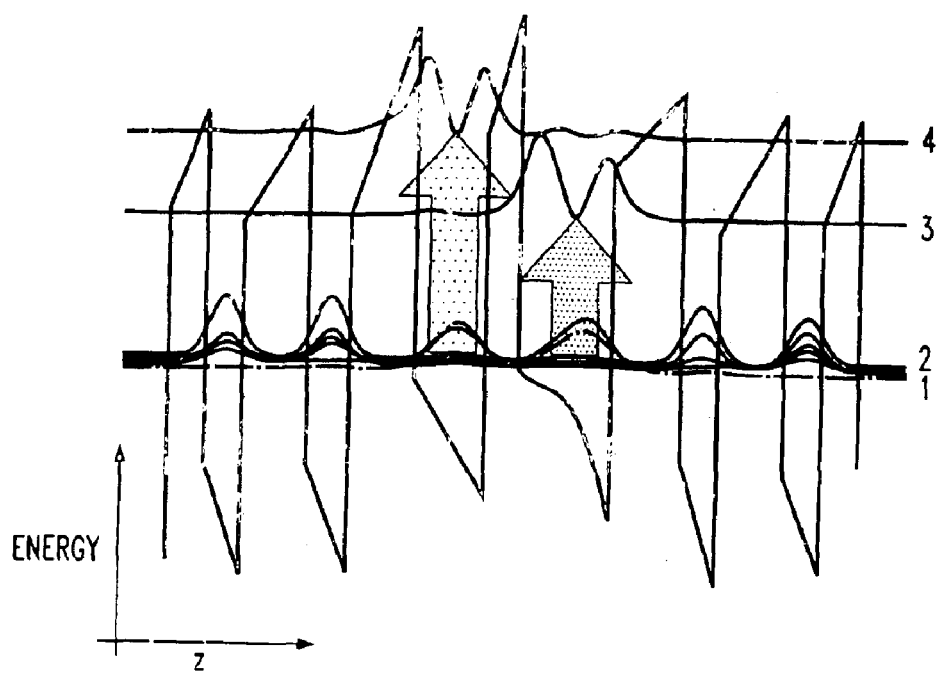
FIG. 7A shows a portion of the conduction band energy diagram of a sample with asymmetric DQWs.

The structures were modeled by iteratively solving Schroedinger's and Poisson's equations. FIG. 7A and the inset in FIG. 6 show the results of such calculations. An intrinsic electric field in the barrier layers and wells of ±5 MV/cm, respectively, was assumed. It has been verified that the result will be qualitatively the same and quantitatively within a few percent even if zero electric field was assumed.

It has been established that very narrow quantum well layers, e.g., less than 20 Å wide, are needed to reach IS transitions with wavelengths around 1.55 μm. For coupled quantum well layers 15 Å and 20 Å thick, ground-state anti-crossing energies of 5, 19, 43, and 131 meV for barrier thicknesses of 15, 10, 7, and 3 Å, respectively, were calculated. In particular, a typical barrier thickness where the anti-crossing energy equals the LO phonon energy would be 4.5 Å, i.e., approximately 1.5 monolayers. This may be prohibitively thin taking into account ubiquitous monolayer fluctuations. However, excited-state level anti-crossing energies can be substantially larger. Similarly, narrower quantum well layers also lead to a larger anti-crossing, though in very thin quantum well layers only a single energy level may remain confined.

For the calculation of the anti-crossing energies, the external electric field normal to the quantum well layers was varied and the closest energy separation of the first two states of DQWs was determined. Varying the internal piezo-electric and pyro-electric fields had essentially the same effect. However, since the latter are not known, degenerate doping of the structures was used to screen them, such that a common Fermi-level was achieved across all quantum wells. This resulted in full anti-crossing of the quantum well ground-states independent of the intrinsic electric fields, as shown in FIGS. 6 and 7A. Fermi-energies for the various samples of 100–200 meV were estimated.

The experimental procedures for the IS absorption measurements have previously been described in the above-cited article C. Gmachl et al., "Intersubband Absorption in GaN/AlGaN Multiple Quantum Wells in the Wavelength Range of λ~1.75–4.2 μm," Appl. Phys. Lett., 77, pp. 334–336 (2000), which is incorporated herein by reference. Although FIGS. 6–8 show absorption in arbitrary units, the absorption signal was quite strong, up to 50% for the approximately 5 mm long multi-pass samples.

FIG. 6 shows absorption in arbitrary units as a function of wavelength in micrometers. The results of the symmetric DQW, sample N306, are shown as a solid black line. The inset within FIG. 6 shows a schematic conduction band profile, energy "E" versus growth direction "z", and moduli squared of the electron wavefuntions of the symmetric 12/10/12 Å GaN/AlGaN DQW structure (sample N306 of Table 1). The squared wavefunctions and energy levels involved in the optical transitions (block arrows) are numbered 1–4.

The experimentally obtained absorption is depicted as a function of wavelength. Usually, such absorption traces, when plotted versus energy, can be fitted well with Lorentzian line-shape functions. In the particular case of FIG. 6, however, a least-square fit employing only a single Lorentzian curve (solid gray line) does not provide a satisfactory result compared to a fit using the sum of two Lorentzians (long dash). The individual Lorentzians are depicted by the short dash curves. The peak transition energies are 816 meV (1.52 μm) and 920 meV (1.35 μm), with a peak separation of 104 meV, which is also the value expected from the band structure calculation shown in the inset. This measurement serves as an example for excited-state anti-crossing. The ground-state anti-crossing energy is calculated as 21 meV, which is much smaller than the energy width of the transitions, such that the two states were treated as being essentially indistinguishable.

FIG. 7A displays a conduction band profile and moduli squared of the electron wavefunctions calculated for an asymmetric 15/7/20 Å GaN/AlGaN DQW structure with doped SL barriers by self-consistently solving Poisson's and Schroedinger's equations for an effective doping level of approximately $2 \times 10^{19}$ cm$^{-3}$. The superlattices were modeled with 15 Å wide $Al_{0.65}Ga_{0.35}N$ barriers and 8 Å wide GaN wells. The energy levels involved in the optical transitions (block arrows) are numbered 1–4. The growth direction "z" indicates Levels 1 and 2 are anti-crossed by 34 meV, a small value compared to the broadening of each transition, which could not be resolved.

Figure 7B:
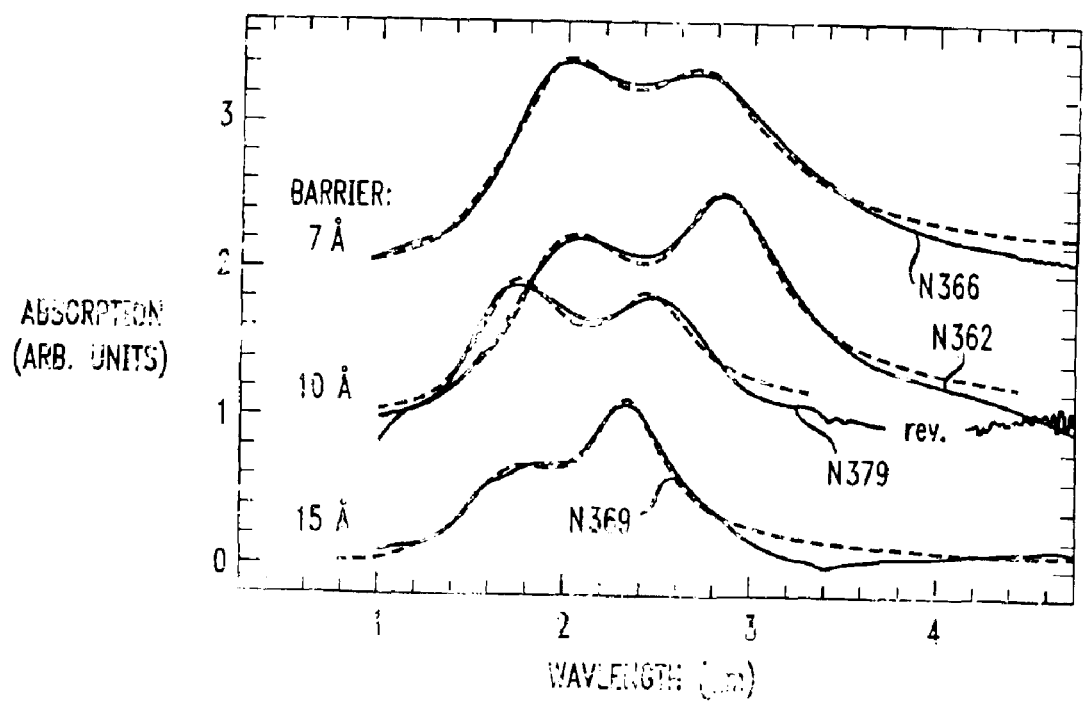
FIG. 7B shows the measured absorption of four variations of the asymmetric DQWs of FIG. 7A.
Figure 8:
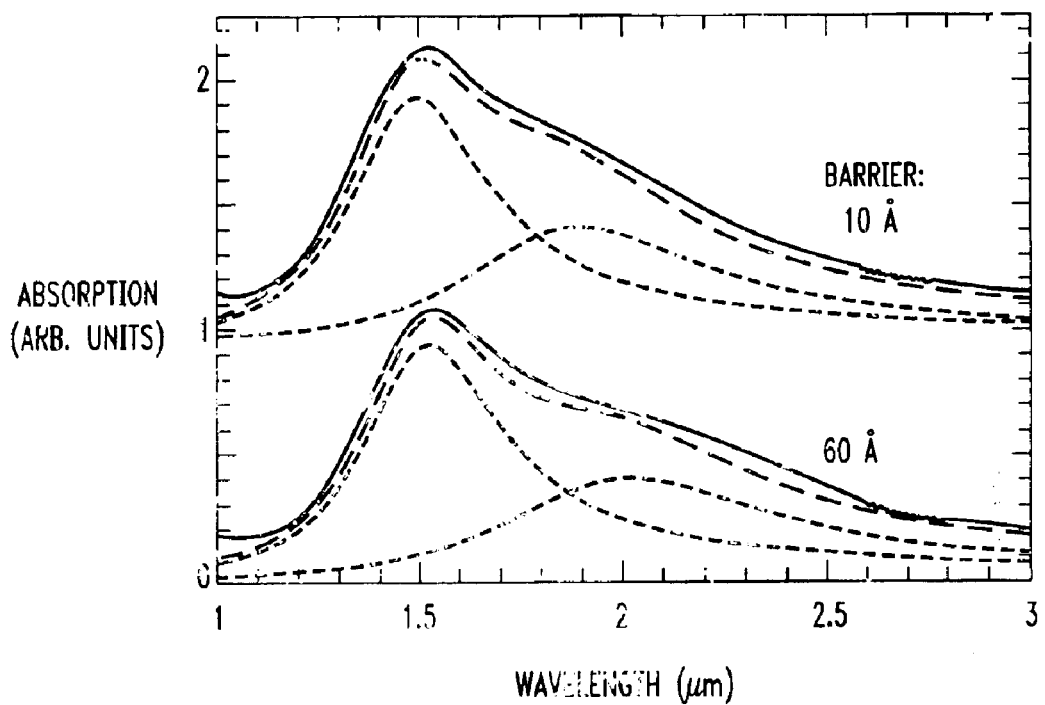
FIG. 8 shows a comparison of the conduction band energy of a sample having asymmetric DQWs with a barrier thickness of 10 Å and that of a sample having similar DQWs, but with barriers of 60 Å.

FIG. 7B shows measured intersubband absorption spectra of samples N366, N362, N378, and N369 (top-to-bottom, solid lines) as a function of wavelength and their respective least square fit curves (dashed) using sums of two Lorentzian line shape functions. The barrier layer thicknesses of the DQWs are indicated. Sample N378, marked "rev.," was grown under modified conditions leading to thinner layers and accordingly shorter peak absorption wavelengths. The variations between the curves are attributed to fluctuations in layer thicknesses between samples. In fact, invoking a previously obtained calibration of peak wavelength versus quantum well thickness described in the above-cited H. M. Ng et al., "Molecular Beam Epitaxy of GaN/Al$_x$Ga$_{1-x}$N Superlattices for 1.52–4.2 µm Intersubband Transitions," J. Cryst. Growth, 220, pp. 432–438 (2000) and H. M. Ng et al., "In Situ Determination of Growth Rate by Pyrometric Interferometry During Molecular-Beam Epitaxy: Application to the Growth of AlGaN/GaN Quantum Wells," J. Vac. Sci. Technol., A19, pp. 292–294 (2001), all four curves can be overlapped precisely, within the experimental error.

FIG. 8 shows measured intersubband absorption spectra of samples N326 and N325, (top-to-bottom, solid lines) and their respective least square fit curves (long dash), sums of two Lorentzian line shape functions. The individual Lorentzians are shown with the short dash curves. The measured data have been offset by +0.05 from their respective fit curves; and N326 is in its entirety offset from N325. The barrier layer thicknesses of the DQWs are indicated. From the calculations discussed in FIGS. 6, 7A and 7B, the lack of any effect from the 10 Å thin barrier layer was confirmed by the data shown in FIG. 8. A coupling effect across a 10 Å wide barrier layer can only be observed for the symmetric DQW (N306) where the excited states are brought into anti-crossing by energetically aligning the ground-states. Two absorption lines, centered at 1.5 µm and 2.0 µm, corresponding to the two isolated quantum wells can be distinguished.

A sample (N367, not shown) having asymmetric DQWs including a 9 Å wide quantum well, displayed only a single absorption feature. This is consistent with a narrow well with approximately 0.65 AlN-mole fraction barriers having no localized excited state.

EXAMPLE 3

Figure 9:
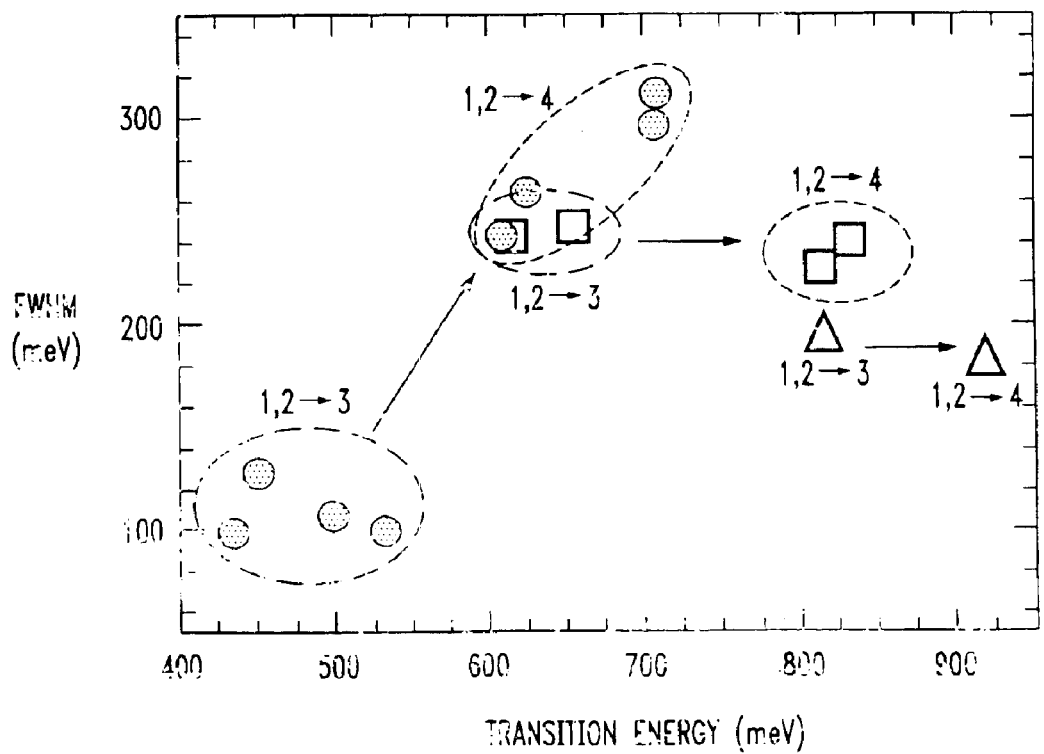
FIG. 9 is a graph of full width half maximum (FWHM) values versus peak transition energies for the absorption spectra of various DQWs.

So far, only the peak transition energy data have been discussed. However, the full width at half maximum (FWHM) of the observed absorption features also provides valuable information. FIG. 9 displays the FWHM in meV as a function of the peak transition energy in meV for the various samples. The data are grouped by sample type and AlN-mole fraction.

The numerical values have been extracted from the least square fits as shown in FIGS. 6–8. Gray circles indicate the asymmetric DQWs of FIG. 7B having approximately 0.65 AlN-mole fraction barrier layers. Transitions into the lower-lying state "3" are grouped by a long-dashed ellipsoid. Transitions into the higher-lying level "4" are grouped by the dotted ellipsoid. Solid squares denote the asymmetric DQWs of FIG. 8, and the solid triangles indicate the symmetric DQW of FIG. 6 (N306). The latter three employ approximately 0.90 AlN-mole fraction barrier layers. A plot of the FWHM value as a percentage of the peak transition energy versus the latter yields a qualitatively very similar picture.

As can be seen, absorption into the higher lying level 4 is significantly broadened compared to absorption into level 3 in samples with only approximately 0.65 AlN-mole fraction barrier layers. Samples with approximately 0.90 AlN-mole fraction show no significant difference in the FWHM values for absorption into higher and lower lying states. This is interpreted as a loss of confinement for the upper state 4 in the low AlN-mole fraction material, i.e., the upper state 4 is less localized. The generally larger FWHM values of the approximately 0.90 AlN-mole fraction samples can be explained by the fact that the quantum well structures are doped rather than the SLs.

The above examples illustrate measurement of intersubband absorption in coupled GaN/AlGaN DQWs in accordance with the invention. The samples were grown by molecular beam epitaxy on sapphire substrate and with large (0.65 or 0.9) AlN-mole fraction in the barrier layers. Peak absorption wavelengths as short as 1.35 µm and 1.52 µm were measured for a symmetric DQW of 12 Å wide wells coupled by a 10 Å wide barrier layer, which also showed evidence of excited-state anti-crossing. As expected, asymmetric DQWs displayed no such anti-crossing, and the ground-state anti-crossing energies were found to be much smaller, as a result of the comparatively large effective electron mass, than the energy broadening of individual transitions. Degenerate doping of the DQWs was used to establish a common reference energy at the Fermi-level, which allows overcoming uncertainties related to intrinsic internal piezo-electric and pyro-electric fields. The asymmetric DQWs displayed peak absorption wavelengths between 1.5 and 2.9 µm.

It is to be understood that these and other embodiments and variations shown and described in the examples set forth above and the figures herein are merely illustrative of the principles of this invention and that various modifications may be implemented by those skilled in the art without departing from the scope and spirit of the invention.

We claim:

1. A quantum well structure comprising two or more quantum well layers coupled by at least one barrier layer such that at least one of a piezo-electric field and a pyro-electric field is produced, the coupling permitting alignment of a Fermi energy of the two or more quantum well layers and wherein said quantum well structure is sufficiently doped to cause the aligned Fermi energy to be located between ground states and excited states of the coupled quantum well layers, and further wherein isolated ground states of the coupled quantum well layers are aligned with one another.

2. The structure of claim 1, wherein the quantum well structure comprises two quantum well layers coupled by a common barrier layer located between said two quantum well layers.

3. The structure of claim 1, wherein the quantum well layers comprise gallium and nitrogen.

4. The structure of claim 1, wherein the barrier layer comprises aluminum, gallium, and nitrogen.

5. The structure of claim 1, wherein the quantum well structure is doped with silicon.

6. The structure of claim 5, wherein the quantum well structure is doped with silicon to a density of about $1\times10^{19}$ cm$^{-3}$ to about $5\times10^{20}$ cm$^{-3}$.

7. The structure of claim 1, wherein the barrier layer is from about 5 Å to about 20 Å wide.

8. The structure of claim 1, wherein the quantum well layers are each from about 5 Å to about 25 Å wide.

9. The structure of claim 1, wherein the quantum well layers are substantially identical.

10. The structure of claim 1, wherein said barrier layer comprises an AlN mole fraction of between about 0.5 to 1.0.

11. The structure of claim 1, wherein a ratio of the widths of the two quantum well layers is less than 0.8.

12. A layered semiconductor comprising:
a plurality of quantum well structures, wherein at least one of said quantum well structures comprises two or more quantum well layers coupled by at least one barrier layer such that at least one of a piezo-electric field and a pyro-electric field is produced, the coupling permitting alignment of a Fermi energy of the two or more quantum well layers and wherein said at least one of said quantum well structures is sufficiently doped to cause the aligned Fermi energy to be located between ground states and excited states of the coupled quantum well layers, and further wherein isolated ground states of the coupled quantum well layers are aligned with one another; and
at least one barrier region, said barrier region disposed to interleave said plurality of quantum well structures.

13. The semiconductor of claim 12, wherein the at least one of said quantum well structures comprises two quantum well layers coupled by a common barrier layer located between said two quantum well layers.

14. The semiconductor of claim 12, wherein the barrier region comprises an AlN mole fraction of between about 0.5 to 1.0.

15. An apparatus, comprising:
an optical waveguide comprising a layered semiconductor, said semiconductor comprising (i) a plurality of quantum well structures, wherein at least one of said quantum well structures comprises two or more quantum well layers coupled by at least one barrier layer such that at least one of a piezo-electric field and a pyro-electric field is produced, and wherein said at least one of said quantum well structures is sufficiently doped to cause a Fermi energy to be located between ground states and excited states of the coupled quantum well layers; and (ii) at least one barrier region, said barrier region disposed to interleave said quantum well structures; and
an energy source configured to supply energy to said at least one of said quantum well structures.

16. The apparatus of claim 15, wherein the waveguide comprises cladding disposed around the semiconductor.

17. The apparatus of claim 16, wherein the waveguide couples to an optical feedback device to form a laser cavity.

18. The apparatus of claim 15, wherein said energy source is at least one of a light source or an electrical source.

19. The apparatus of claim 18, wherein said layered semiconductor comprises optical properties that are modulated by light or electricity supplied by said energy source.

20. The apparatus of claim 18, wherein said energy source is configured to pump said quantum well structure.

21. A method for aligning energy levels of coupled quantum well layers within a quantum well structure comprising two or more quantum well layers coupled by at least one barrier layer such that at least one of a piezo-electric field and a pyro-electric field is produced, said method comprising doping said quantum well structure sufficiently to cause a Fermi energy to be located between ground states and excited states of the coupled quantum well layers, and further wherein isolated ground states of the coupled quantum well layers are aligned with one another.

22. The method of claim 21, wherein the quantum well structure is doped with silicon to a density of about $1\times10^{19}$ cm$^{-3}$ to about $5\times10^{20}$ cm$^{-3}$.

* * * * *

UNITED STATES PATENT AND TRADEMARK OFFICE
CERTIFICATE OF CORRECTION

PATENT NO. : 6,891,187 B2
DATED : May 10, 2005
INVENTOR(S) : Cho et al.

It is certified that error appears in the above-identified patent and that said Letters Patent is hereby corrected as shown below:

Title page,
Item [56], References Cited, U.S. PATENT DOCUMENTS, insert:
-- 6,288,410   09/11/01   Miyazawa
   5,521,398   05/28/96   Pelekanos et al. --.

Column 7,
Line 13, before "The" and after "and" replace "$dW_2$" with -- $d_{w2}$ --.

Signed and Sealed this

Twenty-fifth Day of October, 2005

JON W. DUDAS
*Director of the United States Patent and Trademark Office*